(12) United States Patent
Hunt et al.

(10) Patent No.: US 9,994,953 B2
(45) Date of Patent: Jun. 12, 2018

(54) PORTABLE DRY NANOCOATING MACHINE

(75) Inventors: Andrew Tye Hunt, Atlanta, GA (US); Ian Campbell, Newnan, GA (US); Holly E. Harris, Fairburn, GA (US)

(73) Assignee: nGimat Co., Norcross, GA (US)

( * ) Notice: Subject to any disclaimer, the term of this patent is extended or adjusted under 35 U.S.C. 154(b) by 0 days. days.

(21) Appl. No.: 12/702,775

(22) Filed: Feb. 9, 2010

(65) Prior Publication Data
US 2010/0285230 A1 Nov. 11, 2010

Related U.S. Application Data (60) Provisional application No. 61/151,358, filed on Feb. 10, 2009.

(51) Int. Cl.
*C23C 16/40* (2006.01)
*B05B 7/06* (2006.01)
*B05C 11/10* (2006.01)

(52) U.S. Cl.
CPC .............. *C23C 16/401* (2013.01); *B05B 7/06* (2013.01); *B05C 11/1005* (2013.01); *Y10T 428/24355* (2015.01)

(58) Field of Classification Search
USPC ......... 427/446; 902/902; 118/300, 302, 308, 118/47, 665, 679–681, 715, 722, 723 R; 977/902
See application file for complete search history.

(56) References Cited

U.S. PATENT DOCUMENTS

| | | | | |
|---|---|---|---|---|
| 5,273,957 A | * | 12/1993 | Schwarz et al. | 505/452 |
| 5,409,537 A | | 4/1995 | Poullos et al. | |
| 5,814,585 A | * | 9/1998 | Riddle et al. | 505/425 |
| 5,863,604 A | * | 1/1999 | Hunt et al. | 427/248.1 |
| 6,013,318 A | * | 1/2000 | Hunt et al. | 427/248.1 |
| 6,193,911 B1 | * | 2/2001 | Hunt et al. | 252/518.1 |
| 6,254,940 B1 | * | 7/2001 | Pratsinis et al. | 427/562 |
| 6,424,091 B1 | * | 7/2002 | Sawada et al. | 315/111.81 |
| 6,576,861 B2 | | 6/2003 | Sampath et al. | |
| 6,722,584 B2 | * | 4/2004 | Kay et al. | 451/439 |
| 6,740,624 B1 | * | 5/2004 | Hoste et al. | 505/480 |
| 6,793,975 B2 | | 9/2004 | Hunt et al. | |
| 7,351,449 B2 | * | 4/2008 | Hunt et al. | 427/248.1 |
| 2002/0015797 A1 | | 2/2002 | Hunt et al. | |
| 2002/0058143 A1 | * | 5/2002 | Hunt et al. | 428/412 |
| 2002/0069828 A1 | * | 6/2002 | Penelon et al. | 118/723 MP |
| 2003/0215644 A1 | * | 11/2003 | Deshpande et al. | 428/416 |
| 2004/0063054 A1 | * | 4/2004 | Cain | 431/12 |
| 2005/0233066 A1 | * | 10/2005 | Sunagawa et al. | 427/58 |

(Continued)

FOREIGN PATENT DOCUMENTS

| | | |
|---|---|---|
| GB | 2479326 B | 12/2014 |
| GB | 2514297 B | 12/2014 |

*Primary Examiner* — Yewebdar T Tadesse
(74) *Attorney, Agent, or Firm* — Bell & Manning, LLC (57) ABSTRACT

Nano technologies are widely recognized as enabling enhanced and new functionality in a wide range of applications and products. Many different ways have been developed to create and apply these nanomaterials. One method for making dry nanocoatings is vapor deposition. There exists a need for a portable machine that can apply nanocoatings to a wide of range of surfaces in a wide range of locations. The present invention comprises such a portable machine that can apply nanocoatings to a wide of range of surfaces in a wide range of locations.

10 Claims, 8 Drawing Sheets

(56) References Cited

U.S. PATENT DOCUMENTS

| | | |
|---|---|---|
| 2006/0090593 A1* | 5/2006 | Liu .................................. 75/252 |
| 2007/0045289 A1* | 3/2007 | Kott et al. ..................... 219/543 |
| 2007/0077363 A1* | 4/2007 | Kitamura et al. ............. 427/446 |
| 2008/0118734 A1* | 5/2008 | Goodwin et al. ............. 428/221 |
| 2008/0280056 A1* | 11/2008 | Maric et al. .................. 427/446 |
| 2009/0095021 A1* | 4/2009 | Rajala ............................ 65/60.5 |
| 2009/0233088 A1* | 9/2009 | Lewis et al. .................. 428/331 |
| 2009/0291024 A1* | 11/2009 | Maedler et al. .............. 422/68.1 |
| 2010/0170937 A1* | 7/2010 | Calla ............................. 228/165 |

\* cited by examiner

PORTABLE DRY NANOCOATING MACHINE

CROSS-REFERENCE TO RELATED APPLICATION

This application claims benefit under 35 U.S.C. § 119(e) of U.S. Patent Application No. 61/151,358, filed Feb. 10, 2009, which is hereby incorporated herein by reference in its entirety.

BACKGROUND TO THE INVENTION

Nano technologies are widely recognized as enabling enhanced and new functionality to a wide range of applications and products. There have been many different ways developed to create and apply nanomaterials. One method for making dry nanocoatings is vapor deposition.

There is a continuing need for a non-vacuum deposition machine that can apply dry-deposited nanocoatings to a wide of range of surfaces in a wide range of locations. Embodiments of the present invention comprises such a machine that can apply dry-deposited nanocoatings to a wide range of surfaces in a wide range of locations and can do so using low electrical power.

There are many different vapor deposition processes. Most of these require a very low-pressure environment to function. Some chemical vapor deposition (CVD) techniques can operate at or near atmospheric pressure. One such technique is the combustion chemical vapor deposition (CCVD) process (U.S. Pat. No. 5,652,021). There is a continuing need for such a process that can be used in a wide variety of locations; embodiments of the present invention satisfy this need. In fact, an embodiment of the current invention comprises a machine that can be plugged into a standard electrical outlet, allowing a wide range of people to apply high-quality vapor-deposited nanocoatings on a wide range of surfaces in a wide range of locations, a capability which did not exist prior to the present innovation.

BRIEF DESCRIPTION OF THE DRAWINGS

FIG. 1. Image of the side of the example P15ANSC machine, with side panel removed, to allow access for the leak check.

FIG. 2. Circles indicate places that need to be checked for leaks. The blue circles are joints or valves where leaks can occur. The item circled in red is the in-line filter that needs to be changed periodically.

FIG. 3. Orange flame indicates flushing solvent is being pumped. The P15ANSC is not ready for deposition.

FIG. 4. Green flame indicates that antimicrobial solution is being pumped and the P15ANSC is ready for deposition.

DESCRIPTION OF THE INVENTION

Embodiments of the present invention comprise a non-vacuum deposition machine that can apply dry-deposited nanocoatings to a wide of range of surfaces in a wide range of locations. An embodiment of the current invention comprises a machine that can be plugged into a standard electrical outlet, allowing a wide range of people to apply high-quality vapor-deposited nanocoatings on a wide range of surfaces in a wide range of locations. In an illustrative embodiment, the nanocoating layer that coats the substrate has a thickness of less than 100 nanometer (nm).

One embodiment of the present invention is a low-power-consuming portable dry nanocoating machine that uses the principles of the CCVD process. A precursor in the correct concentration is fed into a flame, where it is burned, and the resulting chemically changed material then condenses onto a surface. It is important that the material is made small enough so that it adheres to the surface. If particles are made, these will not adhere well to the surface and can readily be wiped away. Thus, it is desirable that most of the material be deposited, so an adherent coating is made. This requires that the material in the gas stream be in the form of small clusters of atoms or vapors of the material to be deposited.

One familiar with the art might refer to these gas-borne materials as being "sub-critical sized" clusters (with larger-than-critical size materials being stable particles). A cluster is a grouping of atoms that are composed of elements with a combined bulk vaporization point above the temperature present in its exact location, and thus they can form stable condensates. A cluster remains in a vapor until it reaches the critical nucleus size at which a cluster will no longer combine with another similar composition and sized cluster, and the cluster then becomes a stable solid particle. Such particles also do not form strong bonds to surfaces that vapor clusters can bond to. Critical nucleus size varies with composition, and at 20° C. can be a small as 1 nm for some high melting point materials, such as Pt or refractory oxides, or over 100 nm for salts and low melting point metals or oxides. As the temperature is raised, the critical nucleus size increases continually to a point near the melting point, above which there exists only liquid and cluster bonding and growth is no longer size-limited. One skilled in condensed matter materials processing can determine the critical size relation to composition and temperature.

The current invention uses a series of largely off-the-shelf parts and assembles them into a practical machine that simplifies the production of nanocoatings, so that a wide range of people can make such coatings. Central to the nanocoating machine is a computer device, such as a PLC (programmable logic controller), that controls which components operate and when. Also important is that the machine not be too heavy and can be operated with a practical power input. Thus, all components run on low amounts of electricity and do not use difficult-to-obtain gases. It is also desired to have the parts be reliable and the machine certified for use in most locations; thus, parts having UL or other such listings are preferred.

The feedstock into the machine can be gas or liquid-based chemicals. To make a flame, as is required with CCVD, the mixture needs to be flammable. To be safe, an auto ignition system with a flame sensor is preferred to ensure that the materials are being burned, so that there will not be a build up of flammable material that could result in an uncontrolled fire or explosion. There are many suitable commercially available flame ignition and sensor devices. Also common in a wide range of burner applications for safe use is a pilot flame to ensure that the main flame continues to burn. To maintain sub-critical sized material clusters, it is important not to allow much time between reaction and deposition. Higher velocities help to reduce time. Higher velocity flames are more difficult to maintain in ignition, so a continuous operating pilot flame is preferred. The machine preferably uses air and does not need bottled oxygen or inert gases.

There are a number of small flame burners that can be used as a pilot. Most preferred are those that can operate with air. To reduce heat and the amount of fuel required, the pilot is preferably a small flame. A common type of pilot fuel is propane, from, e.g., cylinders used for camping gear or those used for plumbing and home improvement projects.

These cylinders use the same connectors and thus allow connection to the machine. Different countries will have their types of common fuels and connectors, and the machine can be adapted for use in other countries by changing the input connector and pilot flame head to operate with these containers and the fuel. It is desired that the pilot fuel be a gas at STP and the source container is under pressure, so that no pump is required to enable flow to the pilot burner head. A pilot flame is desired over a glow plug to maintain the CCVD flame as the solid surface of a glow plug will be continuously exposed to the deposition material, causing a buildup of the material being deposited onto the glow plug and causing it to become dysfunctional over time.

Because electronics require electricity to run, a practical electrical input is an important part of the nanocoating machine. It is preferred that the machine simply plug into the local electrical service. The voltage, frequency, and current available differ around the world, and thus the machine must have the appropriate plug and electrical distribution to operate in the area in which it is to be used. This may mean that different components of the machine are used and/or an electrical converter be used so that the machine will operate in any area.

In the United States, the most common electrical outlets available provides 60 Hz electricity at about 110-120 V and is rated to either 15 or 20 amps, and thus a preferred embodiment of the invention is a machine able to operate with this electrical supply. Higher-powered machines can be used, but their ease of use will diminish. Higher power receptacles are fairly common, at 110 V and 20 A and more power can be obtained at about 220 V. There are a number of even higher power plugs available with more exotic plugs for multi-phase electricity. Portable power generators can also be a part of the machine or used with the nanocoating machine to supply the electricity needed. Overall, it is preferred that less than 2200 W of electricity is required, and more preferably, less than 1600 W is required. A portable generator or electrical storage and supply device can also be used to run the electronics and power various components, and these are smaller in size if the power level required is smaller.

A wide range of materials can be made with the portable coating machine, depending on the precursors inputted into the machine. It is widely understood in the CVD field how to alter the feed material to yield various coating compositions. Many gas CVD precursors are expensive, dangerous, limited to just a few elements, or sensitive. Many CVD practitioners use liquid or solid precursors with high vapor pressures. While there are more candidates than gas precursors, these are more expensive, sensitive to degradation, dangerous to use, or not available for all desired elements. Also, multiple feeders are needed when multiple elemental compositions are to be deposited, and these require high-precision components to ensure the proper feed amounts of each elemental precursor. Possible precursors with the lowest cost, most stability, most environmental friendliness and widest use in large-scale chemical applications, other than traditional CVD, are soluble chemicals such as nitrates and various metal organics. These can then be mixed in the right amount and dissolved in various liquids to form CCVD precursor solutions, as has been disclosed in a number of patents and articles with Andrew T. Hunt as an inventor or author, all of which are incorporated by reference (see, e.g., U.S. Pat. Nos. 5,652,021, 5,858,465, 5,863,604, 6,013,318, 6,368,665, 6,601,776, 6,793,975, 7,351,449; collectively "Hunt Information"). The liquids must be properly atomized and burned to yield an adherent coating, as provided for in the Hunt Information. Thus, using liquid solutions as feedstock provides a low cost and easy to handle form of precursors as the preferred source for the portable nanocoating machine.

To be portable, the machine should preferably be on wheels, more preferably lockable wheels, for safety. To be most ergonomic, it should have easy-to-handle parts that direct the deposition gases at the targeted surface. Because there are numerous devices that are required to make the system function, the portable coating machine has as many as possible components in a main apparatus and then a flexible connector to the coating device end. A connection to the hoses should be readily detachable if there are different heads for coating different surface types. A larger coating head for large areas or floors might have wheels and be readily moved across the surface. A smaller and lighter one for lifting to coat other surfaces is possible, as are more designs for going into crevasses, tubing, ducts, and on specifically shaped surfaces or equipment.

Various substrates can handle different amounts of heat. Flames can ignite other combustible materials. To coat the widest range of materials, the machine should have a coating head that does not allow the flame to touch the surface to be coated. It should also have a function to limit the temperature of the deposition gases to below that which might negatively affect the material to be coated. An air knife intersecting the flame near its end can be used to cool and direct the deposition gas at the substrate surface. This positions the flame so that it is not facing directly at the surface to be coated, and greatly improves the safety of the portable nanocoating machine. Hunt Information provides background on how to ensure an adherent coating can be made on low temperature surfaces.

The application head should contain safety devices that feed back to the system controller so that operating parameters can be changed to make it safe or to shut down the system. Previously mentioned auto igniters and flame sensors are part of this. There can also be thermocouples and IR sensors that monitor the coating head position so that the surface being coated does not get too hot. There can be initial limits where the system goes to a smaller flame or more air to make the deposition gasses cooler, and high temperature limits where the system shuts down automatically.

To make the system as widely useable to a range of people, it must be simple to operate and yield good results with no previous background knowledge of vapor deposition. The on-board controller takes the various components through a sequence to operate properly. This sequence is for pump priming, warming up of components that need this to function smoothly, such as mass flow controllers or atomizers, and when things are ready to start the pilot, gas flows and liquid flow. There are regular shutdown sequences that last minutes to remove all chemical precursors from the lines and then others for such times as emergency stops that are very fast, but do not leave the system in the best mode for extending on-off cycling and longer term operation. The machine is preferably simple enough for most active adults with at least a high school education to operate with training of less than 8 hours.

The electronic controller, along with the properly designed application heads, makes a functional system that most people can use with just basic equipment training. An operating procedure for the system should be simple, such as that written for the first portable coater built (see in the example section). The coating head is designed to provide the correct distance and temperature for the intended coating composition and substrate. Different application heads and solutions are to be used with different coating compositions and substrates. There will be a list for end users to reference that will provide necessary guidance for choices.

A surface does need to be clean to ensure adhesion and uniformity of the coating. It is widely understood there are many ways to prepare the surface prior to being coated, and any of these can be used if the surface is needs to be cleaned prior to using. The surface should be dry prior to coating, as it is difficult to vapor deposit onto out-gassing surfaces.

The deposition gases should be vented away as is generally recommended for all flame residual gases. To enable this, the machine has an application head with a center zone where such items as the pilot flame, CCVD flame and other items, if used, like an air knife, are all located, and surrounding this is an exhaust shroud with intake near the surface being coated. The shroud has an inner liner that extends to near the end of the coating device so that the deposition gases are not sucked in prior to reaching the surface. The outer shroud layer defines the distance to which the substrate should be located and directs the suction to the edge of the deposition area. The deposition gases strike the surface and flow towards the exhaust edge. The shroud is connected to a standard exhaust blower via a connecting hose. From the blower, the gases are directed away for the operator and other people so that no buildup of flame gases occurs where people are located. A filter is used prior to the gases going through the blower to catch debris sucked up along with any residual deposition materials.

When a NanoSpray of solution is combusted to form nanomaterials from a flame, we use the terminology "NanoSpray combustion processing." A stable solution containing the elements to be deposited is formed and put into containers compatible with the nanocoating machine. The operator can then readily change out containers as the coating formulation is used. The machine has a warning system as the container level becomes low and the system goes into automatic shutdown if it empties. There is a second container of flushing solution that is used to remove and purge the lines of the deposition liquids prior to the full shutdown of the system. It is preferred that the machine should not turn on if there is not enough of the flushing solution for the warm up and shut down cycles.

Embodiments of the present invention include
1. A portable dry nanocoating machine.
2. A portable dry nanocoating machine where the process used by the machine is flame-based.
3. A portable dry nanocoating machine where the machine is electrically powered by 2200 W or less.
4. A portable dry nanocoating machine where the machine is electrically powered by 1600 W or less.
5. A portable dry nanocoating machine where the machine uses no bottled oxygen.
6. A portable dry nanocoating machine where the machine uses a standard, widely available pressurized fuel gas bottle for its pilot flame.
7. A portable dry nanocoating machine where the machine uses no bottled inert gas.
8. A portable dry nanocoating machine where the machine uses an auto igniter and flame sensor.
9. A portable dry nanocoating machine where the machine uses an exhaust shroud around the deposition area to remove most of the spent deposition gases and materials.
10. A portable dry nanocoating machine where the machine uses electronics and programs to control the machine's functionality.
11. A portable dry nanocoating machine where the machine is simple enough for most adults to operate it with training of less than 8 h.
12. A portable dry nanocoating machine where the machine uses precursors dissolved in a flammable liquid to form the primary deposition flame and the vapors from which the coating is formed.
13. A portable dry nanocoating machine where the machine uses the CCVD or nanospray combustion process.
14. A portable dry nanocoating machine where the machine uses an air knife to cool and direct the deposition gases to the surface to be coated.
15. A process for applying a vapor coating at about ambient pressure using a portable dry nanocoating machine in almost any location where 2200 W or less electrical power is used without any required inert gases or oxygen other than air.
16. A process for applying a vapor coating at about ambient pressure using a portable dry nanocoating machine in almost any location without any required inert gases or oxygen other than air where a liquid is very finely atomized and burned to create a flame which the resulting gasses are used to deposit the nanomaterial.
17. A process for applying a vapor coating at about ambient pressure using a portable dry nanocoating machine in almost any location without any required inert gases or oxygen other than air where the process is automatically started by an electronic control system that initiates liquid and gas flows and uses pilot flame to ensure the continual combustion of the sprayed liquid solution. Air is entrained into the liquid spray in a ratio to provide for a clean burn and reaction of the chemicals in the liquid so that the material deposited is dry without the original liquid contacting the surface being coated.
18. A process for applying a vapor coating at about ambient pressure using a portable dry nanocoating machine in almost any location without any required inert gases or oxygen other than air, where the process uses an air flow to cool and direct the deposition gasses.
19. A process for applying a vapor coating at about ambient pressure using a portable dry nanocoating machine in almost any location where 2200 W or less electrical power is used without any required inert gases or oxygen other than air where the process uses an exhaust to move the residual deposition gases from in the application area so it remains at a safe level for the equipment operator.
20. A process for applying a vapor coating at about ambient pressure using a portable dry nanocoating machine in almost any location where 2200 W or less electrical power is used without any required inert gases or oxygen other than air where electronics are used to control the process can do so with fewer than seven buttons being required to operate the process in normal operation.

An Example Nanocoating Machine

An initial nanocoating machine was built for the deposition of silver-based antimicrobial nanocoatings onto a wide range of materials and surfaces. As part of the design, many different conditions were run in an open flame system and then a functional application head around the end devices was built. The portable 15 A nano-spray combustion (P15ANSC) machine with rollers was operated from a standard 15 A outlet, a standard propane cylinder, flushing solvent, and deposition solution. All items were mounted on the main machine and a hand-held deposition device was connected to this by flexible connections of about 20 feet in length that enabled the coating head to be easily moved. It was operated on Jan. 23, 2009, by Andrew T. Hunt to make a silver-based nanocoating by passing the coating head, by hand, over some example materials, including Petri dishes for antimicrobial testing. The test results showed very strong antimicrobial action, as shown in Table 1.

TABLE 1

*Salmonella* cell count at 2 h on samples coated with a silver-based nanofilm using a machine of the present invention

| Code | 2 Hour | Coating location and description |
|---|---|---|
| A | 3,900 | nGimat open concrete floor area using the P15ANSC |
| B | 1,900 | nGimat open concrete floor area using the P15ANSC |
| C | 2,900 | nGimat open concrete floor area using the P15ANSC |
| D | 3,500 | nGimat open concrete floor area using the P15ANSC |
| E | 3,800,000 | Control Dish |

The machine comprises a liquid delivery system. There are at least three containers for liquids, including the primary deposition liquid, a flushing liquid, and a waste liquid container. A fourth container can be attached for the primary deposition liquid so that the application can be continuous, by switching directly from one primary deposition liquid container as it empties to another full one. The machine has automatic valves that switch between these containers, as is required for proper operation. The lines allow for flow of the liquid to the pump that regulates the flow rate to either the waste container or the deposition head. There are filters before and after the pump to minimize clogging or wear for the wetted parts. There is also an inline pressure meter that indicates the line pressure downstream of the pump. If the pressure is too high then the system will go into shutdown as the right flow rate might not be produced by the pump. Also, if the pressure is too low, the system will go into shutdown as either the pump is not properly primed or there is a leak in a line that needs to be corrected, and either of these will not have enough of the deposition solution going to the flame making the dry nanocoating.

The pilot flame and air system consists of air supply and exhaust components. Compressed air is supplied to aid in the atomization and combustion of the liquid. The amount and pressure of the air can be controlled by a mass flow controller and the compressor settings. Having the minimum amount of air flow for proper operation keeps the flame from touching the atomizer, so that it does not overheat, causing chemicals to decompose and clog lines and coat other system surfaces. The air flow rate for best operation is usually so that the pilot light is required to maintain combustion of the deposition liquid spray. Too high an air flow rate does not allow for a full combustion of the deposition solution, even with the pilot flame operating properly. A second flame sensor or thermocouples can be used to determine whether the primary deposition flame is burning correctly. The compressed air source for the primary deposition flame should preferably be above 10 psi and more preferably above 30 psi. The exhaust system is designed to carry away much of the combustion byproducts. A blower sucks the gas away from the deposition zone to the potable coater and then out a flexible tube that can be attached to a building central exhaust systems or placed out a window or other exterior opening. If coating outdoors, then it is recommended that the outlet preferably be at least 15 feet from the operator or if closer than this, that it be downwind of the operator.

The flame components are the final components prior to forming the deposition gases. While compressed air could be supplied to the pilot, it is preferable to use a pilot light flame assembly that operates by entraining the appropriate amount of air. The use of a compressed fuel gas enables the fuel gas pilot assembly to use the Venturi effect to cause the proper air mixture to form a stable pilot flame. The pilot gas line has an electronic valve, which the electronic control system opens at the same time it turns on the electronic igniter, which operates at any time the pilot gas is open and the flame sensor does not indicate the presence of the pilot flame. The pilot flame is located just after the atomizing device. A number of atomizers can be used, but the preferred type is one supplied by nGimat Co., called the Nanomiser® device. The right control signals needs to be supplied to whatever atomizer is used. Some devices should not be energized when dry, so care needs to be made that liquid is flowing prior to powering the atomizer.

To help cool the deposition gasses and not have the primary flame directed at the surface to be coated, a gas flow is used to redirect the deposition gases to the surfaces to be coated. An air knife is capable of achieving this functionality, and is readily available to be incorporated into the deposition head assembly. The deposition system can have a mechanically or mass flow control capability to deliver the right amount of air. The air knife should be located about 4-10 cm from the initial burn point of the deposition flame, such that the material being deposited is dry and adherent.

The system has the capability to attach various deposition heads. To facilitate this, all the lines that go between the primary portable unit and the deposition head be attached by a simple attachment system and a flexible tubing and hose line joined together. The largest of these is the exhaust hose, which can be connected similarly to flexible exhaust lines used with vacuum cleaning systems, but designed to operate at least 100° C. Attached to this primary hose will be the lines for pilot flame gas, compressed air supplies, and the primary flame liquid, and well as electrical lines for flame starters, sensors, and controls on the deposition head assembly. On the handle of the deposition head assembly there should be an emergency off switch and a lever for idle or full deposition operation. The operator handle should be thermally isolated from the exhaust gas line and have a solid structure, connecting it to the deposition head so that the operator can continuously hold the handle and manipulate the deposition head over the surface to be coated by holding only the handle. There are a number of different quick-connect systems for industrial equipment that are able to make electrical gas and liquid connections, and these should be used for easy exchange of the dry nanocoating deposition head attachments.

The example system of this invention is designed to work indoors or outdoors near an electrical power source, which could be a generator. If operating only outdoors, some of the main power consuming items such as the blower and pump can be directly powered by internal combustion engines.

A list of components used to make the example system is provided in Table 2. These components make a functional system, but others of similar functionality can be used. These can be readily changed to other components that work with the electrical supply of country where the device is used.

TABLE 2

List of components used to make the example system

| NAC1-P BILL OF MATERIALS | PART NUMBER | MANUFACTURER | VENDOR | QUANTITY |
|---|---|---|---|---|
| POWER DISTRIBUTION | | | | 1 |
| power cord | 11J3548 | SPC | NEWARK | 1 |
| Cord Strain relief | 33C0680 | amphenol | NEWARK | 1 |
| PowerLine Filter | APF120N01 | EATON | Automation Direct | 1 |
| main fuse 15 AMP | AGC15 | Automation Direct | Automation Direct | 1 |
| Din rail mounted fuse holders 110 | DN-F6L110 | Automation Direct | Automation Direct | 1 |
| PLC power supply fuse 1 AMP | AGC15 | Automation Direct | Automation Direct | 1 |
| IO power supply fuse 5 AMP | AGC5 | Automation Direct | Automation Direct | 1 |
| 24 vdc PLC power supply | PS24-O24C | Automation Direct | Automation Direct | 1 |
| 24 vdc IO power supply | PS24-120C | Automation Direct | Automation Direct | 1 |
| power on indicator | ECX2053 | Automation Direct | Automation Direct | 1 |
| mains power DISCONNECT | SD1-016-RR | Automation Direct | Automation Direct | 1 |
| DISCONNECT SHAFT | SD-S200 | Automation Direct | Automation Direct | 1 |
| Remote red-yellow handle | SD-HRY | Automation Direct | Automation Direct | 1 |
| enclosure fans | MC19671 | multicomp | NEWARK | 1 |
| fan FILTER KIT | | multicomp | NEWARK | 1 |
| ignitor 24 vac transformer | 02F532 | TRIAD | NEWARK | 1 |
| E-stop actuator | E22JLB2N8B | Automation Direct | Automation Direct | 1 |
| E-stop name plate | E22VA8 | Automation Direct | Automation Direct | 1 |
| terminal blocks | DN-T12 | Automation Direct | Automation Direct | 1 |
| END COVER | DN-EC1210MN | Automation Direct | Automation Direct | 1 |
| Gnd blocks | DN-G10 | Automation Direct | Automation Direct | 1 |
| hook up wire | 36F181 | BELDEN | NEWARK | 1 |
| Din rail mounted fuse holders 24 | DN-F6L24 | Automation Direct | Automation Direct | 1 |
| CONTROLS | | | | |
| PLC | EZ-220P-PLC-E | EZAutomation | EZAutomation | 1 |
| I/O 4channel TC | EZIO-4THIE | EZAutomation | EZAutomation | 1 |
| I/O 4analog out 4Analog in current | EZIO-4ANI4ANOC | EZAutomation | EZAutomation | 1 |
| I/O 4analog out 4Analog in voltage | EZIO-4ANI4ANOV | EZAutomation | EZAutomation | 1 |
| I/O 8 chan DC input | EZIO-8DCI | EZAutomation | EZAutomation | 1 |
| I/O 8 chan DC output | EZIO-8DCON | EZAutomation | EZAutomation | 1 |
| I/O 4 channel relay | EZIO-4IORLO | EZAutomation | EZAutomation | 1 |
| relays SPDT | 781-1C-24D | Automation Direct | Automation Direct | 7 |
| Han hood top entry | 19 30 024 0447 | Harting | McNoughton-mckay | 1 |
| bulkhead mounting | 09 30 024 0318 | Harting | McNoughton-mckay | 1 |
| dummy module | 09 14 000 9950 | Harting | McNoughton-mckay | 4 |
| pneumatic module male | 09 14 03 4501 | Harting | McNoughton-mckay | 2 |
| pneumatic module male insert | 09 14 000 6153 | Harting | McNoughton-mckay | 3 |
| pneumatic module female insert | 09 14 000 6253 | Harting | McNoughton-mckay | 2 |
| pneumatic module female insert shut off | 09 14 000 6258 | Harting | McNoughton-mckay | 1 |
| dd module male 12 contacts | 09 14 012 3001 | Harting | McNoughton-mckay | 1 |
| dd module female 12 contacts | 09 14 012 3101 | Harting | McNoughton-mckay | 1 |
| pins 1 mm 18 awg | 09 15 000 6122 | Harting | McNoughton-mckay | 5 |
| sockets 1 mm 18 awg | 09 15 000 6222 | Harting | McNoughton-mckay | 5 |
| hinged frame A-F | 09 14 024 0303 | Harting | McNoughton-mckay | 1 |
| hinged frame a-f | 09 14 024 0313 | Harting | McNoughton-mckay | 1 |
| electric storage | 20 70 001 1001 | Harting | McNoughton-mckay | 0 |
| e module female | 09 14 006 3101 | Harting | McNoughton-mckay | 0 |
| quintax male | 09 14 002 3001 | Harting | McNoughton-mckay | 1 |
| quintax female | 09 14 002 3101 | Harting | McNoughton-mckay | 1 |
| pins 1 mm 18 awg ag | 09 15 000 6102 | Harting | McNoughton-mckay | 13 |
| sockets 1 mm 18 awg ag | 09 15 000 6202 | Harting | McNoughton-mckay | 13 |
| relay sockets | 781-1C-SKT | Automation Direct | Automation Direct | 7 |
| relay 4PDT | 784-4C-24D | Automation Direct | Automation Direct | 2 |
| terminal jumpers | DN-100J12 | Automation Direct | Automation Direct | 1 |
| SINGLE OUTLET DIN RAIL RECPTICAL | IMACP01 | AUTOMATION SYSTEMS | AUTOMATION SYSTEMS | 2 |
| terminal jumpers | DN-100J12 | Automation Direct | Automation Direct | 1 |
| TERMINAL LABELS | DN-LAB | Automation Direct | Automation Direct | 1 |
| relay socket 4PDT | 784-4C-SKT-1 | Automation Direct | Automation Direct | 2 |
| SSR for nanocontrol | EM1E23AA25 | GAVAVASSI | GROSS AUTOMATION | 1 |
| rs232-rs485 ADAPTER | FA-ISOCON | Automation Direct | Automation Direct | 1 |
| GASSES | | | | |
| Gast compressor pump | 71r142-p251-d300x | grainger | garainger | 1 |
| ⅜ COPPER TUBING | 5176K6 | McMaster Carr | M | 1 |
| Tip Air MFC 0-20 sccm | GR111-02 | Fathom Technologies | Fathom Technologies | 1 |
| Solenoid valves | SV3110 | Omega Engineering | Omega Engineering | 4 |
| ⅛" SS nuts | SS-202-1 | GA Valve | GA Valve | 4 |
| ⅛" SS ferrules | SS-200-SET | GA Valve | GA Valve | 2 |
| 1/16" SS ferrules | SS-100-SET | GA Valve | GA Valve | 2 |
| 1/16" SS nuts | SS-102-1 | GA Valve | GA Valve | 4 |
| ⅛" SS union | SS-200-6 | GA Valve | GA Valve | 3 |
| 1/16" SS union | SS-100-6 | GA Valve | GA Valve | 3 |
| ⅛" brass nuts | B-202-1 | GA Valve | GA Valve | 4 |

TABLE 2-continued

List of components used to make the example system

| NAC1-P BILL OF MATERIALS | PART NUMBER | MANUFACTURER | VENDOR | QUANTITY |
|---|---|---|---|---|
| 1/8" brass ferrules | B-200-SET | GA Valve | GA Valve | 2 |
| 1/4" brass nuts/ferrules | B-400-NFSET | GA Valve | GA Valve | 2 |
| 1/8" to 1/4" brass bulkhead | B-400-61-2 | GA Valve | GA Valve | |
| 1/4" brass bulkhead | B-400-61 | GA Valve | GA Valve | |
| copper tubing, 1/4", 6 ft | 8967K88 | McMaster Carr | McMaster Carr | 1 |
| Nylon tubing, 1/4", 10 feet | 5548K75 | McMaster Carr | McMaster Carr | 10 |
| PRESSURE TRANDUCER | | Omega Engineering | Omega Engineering | 1 |
| Misc. supplies | Various | Various | Various | 1 |
| Outsourced Labor for parts | Various | Various | Various | 1 |
| 2688CE44 piston pump | 35753 | thomas | Carolina fluid components | 1 |
| filter regulator | B08-02-FL00 | WILKERSON | GRAINGER | 1 |
| HOSE | SS-THPM4PM4-18 | SWAGELOCK | GA Valve | 2 |
| STREET EL | B-4-SE | SWAGELOCK | GA Valve | 3 |
| HEX NIPPLE | B-4-HN | SWAGELOCK | GA Valve | 3 |
| TUBE ADAPTER | B-4-TA-1-4 | SWAGELOCK | GA Valve | 10 |
| TUBE ADAPTER | B-6-TA-1-4 | SWAGELOCK | GA Valve | 3 |
| UNION EL | B-600-9 | SWAGELOCK | GA Valve | 3 |
| UNION TEE | B-600-3 | SWAGELOCK | GA Valve | 1 |
| VALVE | SS-41GXS2 | SWAGELOCK | GA Valve | 1 |
| VALVE | SS-41GXS1 | SWAGELOCK | GA Valve | 1 |
| propane regulator | 350-00 | | the propane store | 1 |
| 24 VOLT SOLENOIDS | SV8COIL-24 VDC | Omega Engineering | Omega Engineering | 3 |
| propane valve | b-40-gs | SWAGELOCK | GA Valve | 1 |
| Redirect air blade | xxxxxxx | Spray systems | Spray systems | 1 |
| Hastings Vacuum pump 24 Vdc | | hastings | hastings | 1 |
| Propane cylinder connection | F-144 | Red Dragon | Red Dragon | 1 |
| FLUID DELIVERY | | | | |
| Fluid Pump | 110PFN01 | Chrom Tech | CHROM TECH | 1 |
| PRESSURE TRANDUCER | DF-SS-01-5000-06 | D. J. INSTRUMENTS | DTP, Inc | 2 |
| 1/16" nut, Valco, 10 pk | U-320 | UPCHURCH | UPCHURCH | 1 |
| 1/16" ferrule, Valco, 10 pk | U-321 | UPCHURCH | UPCHURCH | 1 |
| 1/16" OD" stainless steel tubing, 0.030" ID, 5' | U-107 | UPCHURCH | UPCHURCH | 1 |
| Precolumn filter assembly | A-316 | UPCHURCH | UPCHURCH | 1 |
| 0.5 um stainless steel frit, 10 pk | C-140-30 | UPCHURCH | UPCHURCH | 1 |
| 2-piece fingertight, 1/16", peek, 10 pk | F-300 | UPCHURCH | UPCHURCH | 1 |
| LO-Pulse pulse damper | 12-0527 | CHROM TECH | CHROM TECH | 1 |
| Back pressure regulator, with 500 psi cartridge | U-609 | UPCHURCH | UPCHURCH | 1 |
| Super flangeless ferrule, Peek and SS, 1/16", 10 pk | P-250x | UPCHURCH | UPCHURCH | 1 |
| Bottom-of-the-bottle filter | A-551 | UPCHURCH | UPCHURCH | 1 |
| PEEK Tubing | 10-13-00187 | Optomize Technologies | Optomize Technologies | 1 |
| Pump head replacement | 880301 | Chrom Tech | CHROM TECH | 1 |
| check valve assembly | p-1086 | Chrom Tech | CHROM TECH | 1 |
| piston seal kit | p-010 | Chrom Tech | CHROM TECH | 1 |
| Float level switches | LVK-130 | Omega Engineering | Omega Engineering | 2 |
| Male Luer to 1/4-28 Female, PEEK | P-655 | UPCHURCH | UPCHURCH | 1 |
| Female Luer to 1/4-28 Female, PEEK | P-658 | UPCHURCH | UPCHURCH | 1 |
| PEEK nut 1/16" tubing, 1/4-28 flangeless, 10 | P-235 | UPCHURCH | UPCHURCH | 1 |
| Bayonet Connector | 11-02212-AA | Optomize Technologies | Optomize Technologies | 1 |
| Holder Cup | 11-02333-AA | Optomize Technologies | Optomize Technologies | 1 |
| Holder Tube | 11-02327-AA | Optomize Technologies | Optomize Technologies | 1 |
| Sealing element | 11-02307-AB | Optomize Technologies | Optomize Technologies | 1 |
| Valve Actuator | | SWAGELOCK | Georgia Valve | 2 |
| Opti-Lok fitting (x2) (10-20-00264) | 10-20-00264 | Optomize Technologies | Optomize Technologies | 2 |
| Fluid bottles 1 gal, 1 liter | various | | | 4 |
| EXHAUST | | | | |
| Fire Extinguisher | 6487T72 | McMaster Carr | McMAster-Carr | 1 |
| VAC-N-BLOW | 9848T21 | McMaster Carr | McMAster-Carr | 1 |
| cylinder tie down | | McMaster Carr | McMAster-Carr | 2 |
| Vacuum hose and cuff | | atlas pools | atlas pool | 1 |
| Flame | | | | |
| Nanomiser ® device | | | nGimat | 1 |
| propane bottle | | bernzomatic | lowes | 2 |
| spark generator | 127902 | mhc | accentsshopping.com | 1 |
| ignitor wire | 128056 | mhc | accentsshopping.com | 1 |
| Pinpoint propane torch | 83055 | mirco-mark | micro-mark | 1 |
| 50 C INDICATOR LABEL | L-0333 | My Safety Sign | My Safety Sign | 2 |
| Cadmium-Sulfide flame detector | C554A1463 | Honeywell | PARTSGUY.COM | 1 |

The system does enable ease of operation as can be seen by the first operating procedure, which is as follows. There are five primary operating buttons, an emergency stop button, and a primary power switch, for a total of seven electronic interaction points. There is a connection for programming the electronic controls with an attached computer. On the system, there is a 16-key board for varying some of the flow rates and cycles, but this is for only advanced users and programmers, and should not be used by the daily operators. A touch screen could be used for operator interface, but the amount of user interface should be limited for people trained only as application operators.

Purpose

This quick check guide outlines basic operation procedures for the P15ANSC. It is useful as a reference sheet during depositions.

Scope

This guide will allow a standard operator, with little knowledge or experience with P15ANSC, to run the equipment in basic operation mode.

Definitions

Flushing Solvent: Mixture of solvents used to prepare solution, but without precursors. The flushing solvent for P15ANSC silver-containing nanocoatings was methanol. Flushing solvent is used during the prime sequence and shutdown sequence to clean the tubing and prevent material buildup from occurring.

Solution: Mixture of precursor chemicals and solvents used to form the antimicrobial nanocoating using P15ANSC. Only use Antimicrobial nBloc™ Solution supplied by nGimat or its authorized dealers.

WARNING: ONLY USE THE FLUSHING SOLVENT AND SOLUTION SPECIFICALLY FOR P15ANSC. OTHER LIQUIDS COULD DAMAGE THE SYSTEM.

Solution Preparation

Inspect flushing solvent and solution containers for contaminants. Clean container if any contaminants are present. Ensure there is enough fluid for the deposition area or run time. Containers should be filled (at a minimum half filled) before the deposition is initiated to prevent solution or flushing solvent from running out in mid-deposition. Running the liquid pump with no liquid flow damages the pump and Nanomiser® Device.

Make sure bottom filters in the solution and flushing solvent containers touch (or are very close to) bottom of bottle. If there are contaminates in the container, the filter can be clogged and the filter must be changed. Never operate without the filters as these protect the more expensive downstream components from being clogged or damaged.

Pre-Deposition Setup

Check the waste container (orange cap) and empty if more than half full into an appropriate disposal container.

If standing in front of the control unit where the display panel is located, open the side panel on the left to access components that must be leak checked during the prime sequence, step 0. Check to confirm that the correct panel has been opened.

Plug the P15ANSC into a standard 110 V outlet. The screen display should read "nGimat Systems P15ANSC". This is the default screen.

A prime sequence must be initiated to prepare the liquid pump and eliminate air bubbles in the tubing. This is done by pressing the white 'PRIME' button on the display screen. The initial liquid and gases released during priming go into the waste container.

The small red LED located directly above the PRIME button will light up and stay lit until the prime sequence is complete. The STATUS screen above the display screen will turn from green to yellow while the prime sequence is running.

After about 60 s, the exhaust vacuum located on top of the control unit will turn on, and flushing solvent will begin to exit the Nanomiser device located inside the shroud. The flushing solvent may cause a small puddle to form; it is only methanol and will quickly evaporate. If air enters liquid lines after prime then perform leak check detailed in step 0 while exhaust vacuum is on DURING prime sequence.

When the prime cycle is complete the small LED light located directly above the PRIME button will turn off. The STATUS screen will also change from yellow to green. (Skip if no air in liquid lines) Perform leak check while exhaust vacuum is on during prime sequence.

Figure 1A:
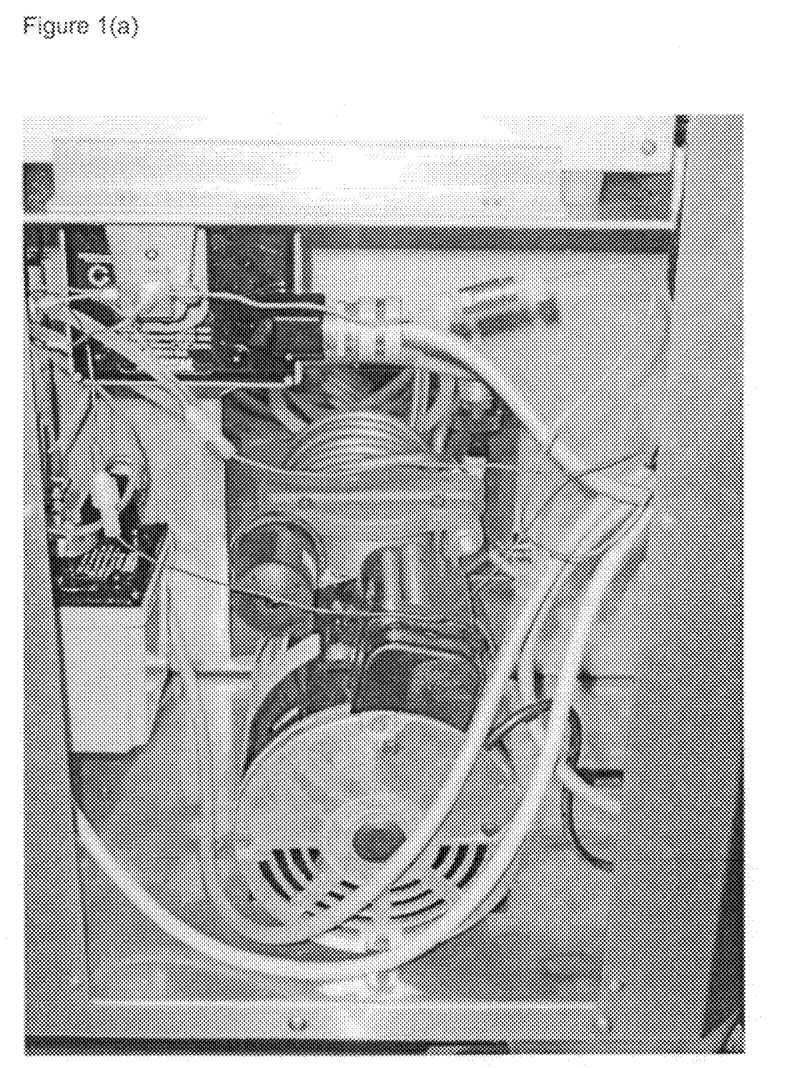
Figure 1B:
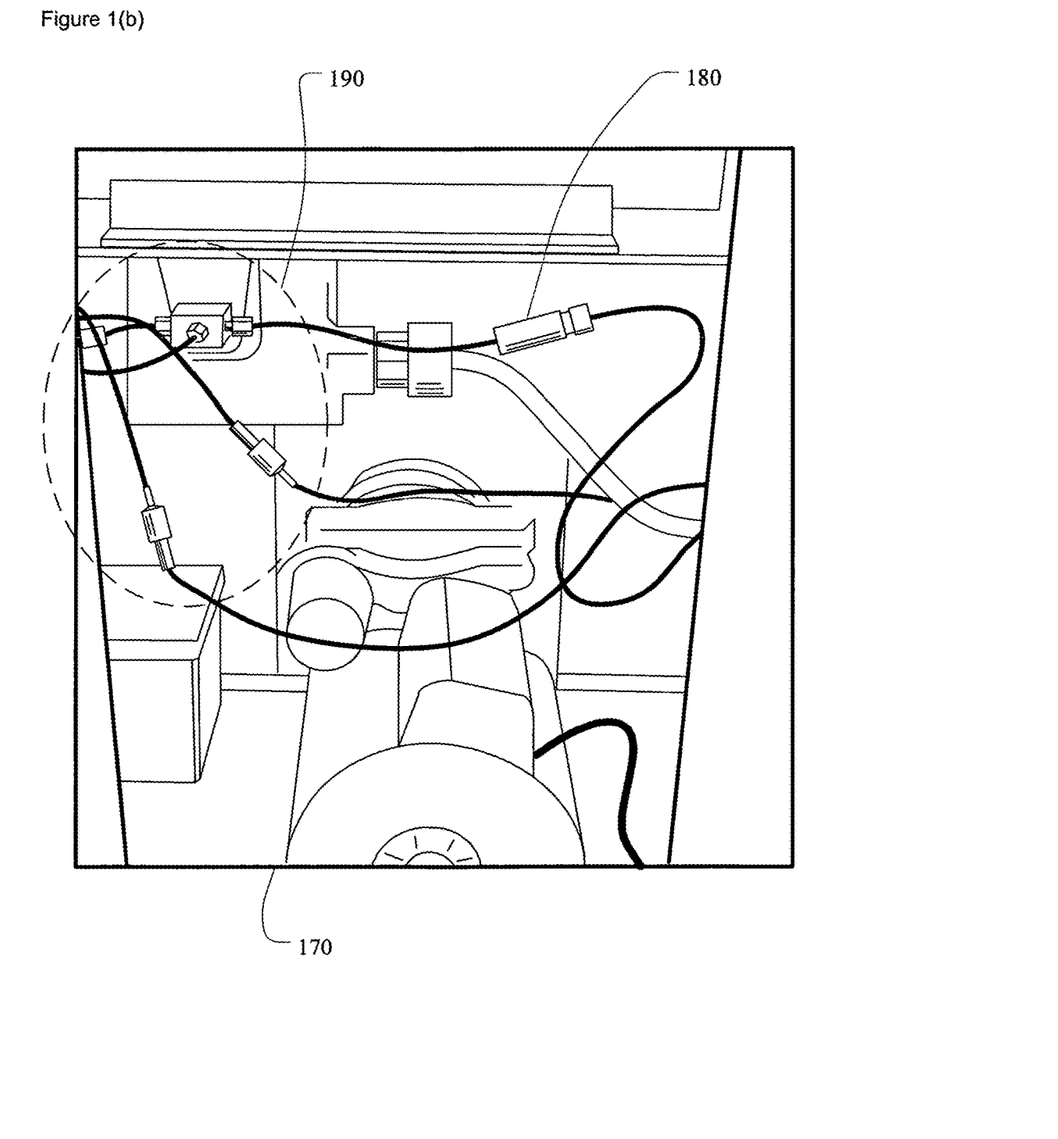
Figure 2A:
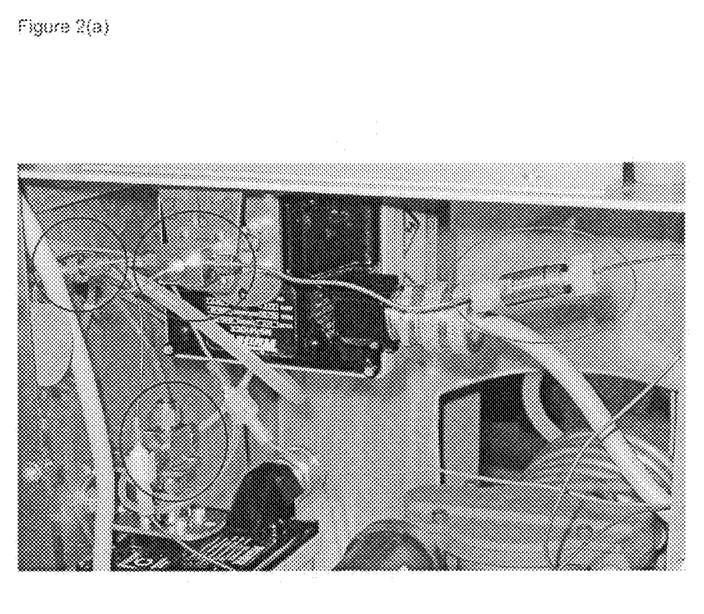
Figure 2B:
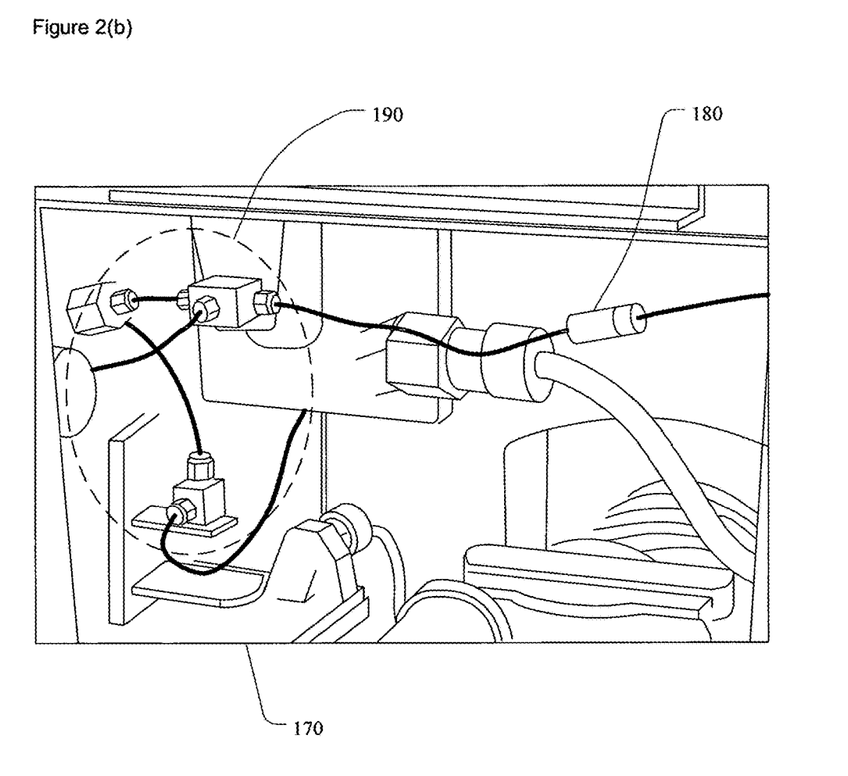

While the exhaust vacuum on top of the control unit is on during the prime sequence, check the circled areas in FIG. 2 with gloved fingers to confirm that no leaks are occurring in the solution line.

If the items circled in blue are leaking, the nuts need to be tightened or replaced.

If the in-line filter circled in red is leaking, try finger-tightening the beige plastic ends. If the leak persists, change the in-line filter. The system should be turned off when making any adjustments.

Repeat prime sequence in step 0 until no leaks are detected.

Starting Deposition

To begin a deposition, press the RUN button. The small LED light directly above the RUN button will turn red and the STATUS screen will change from green to yellow.

Figure 3A:
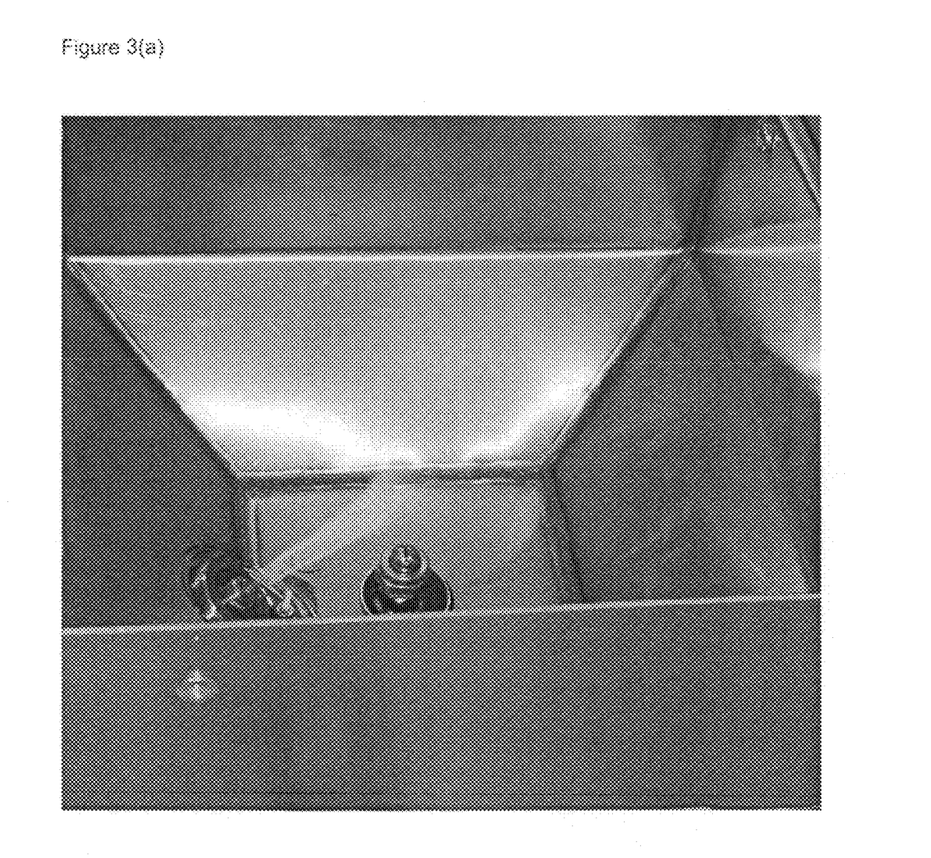
Figure 3B:
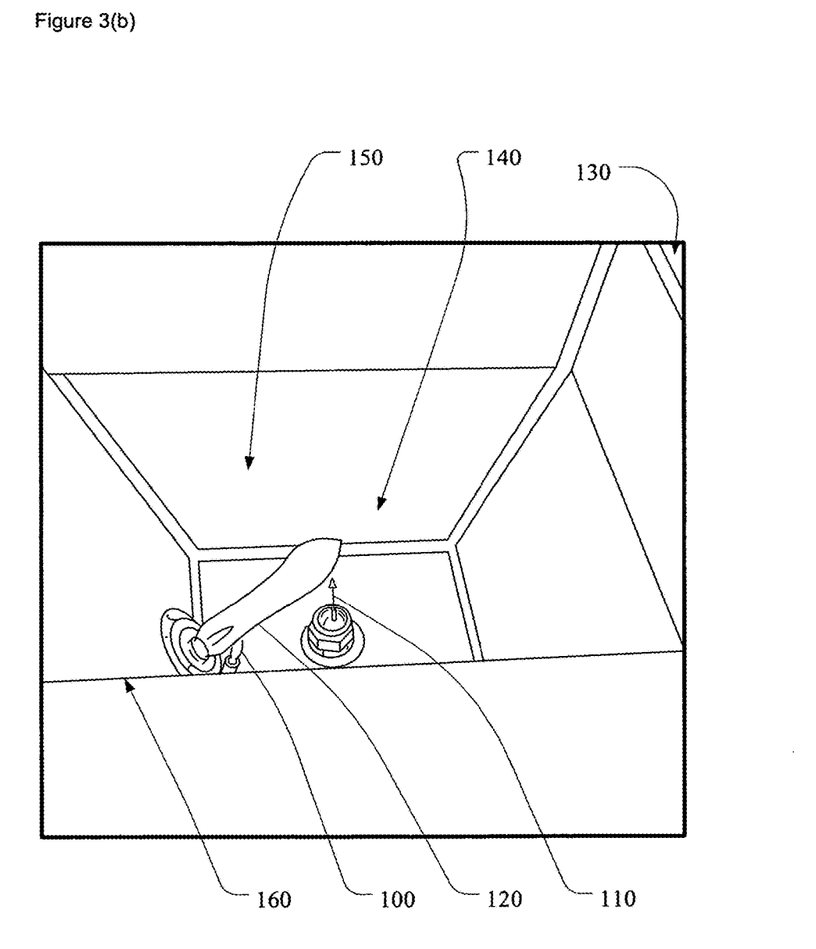
Figure 4A:
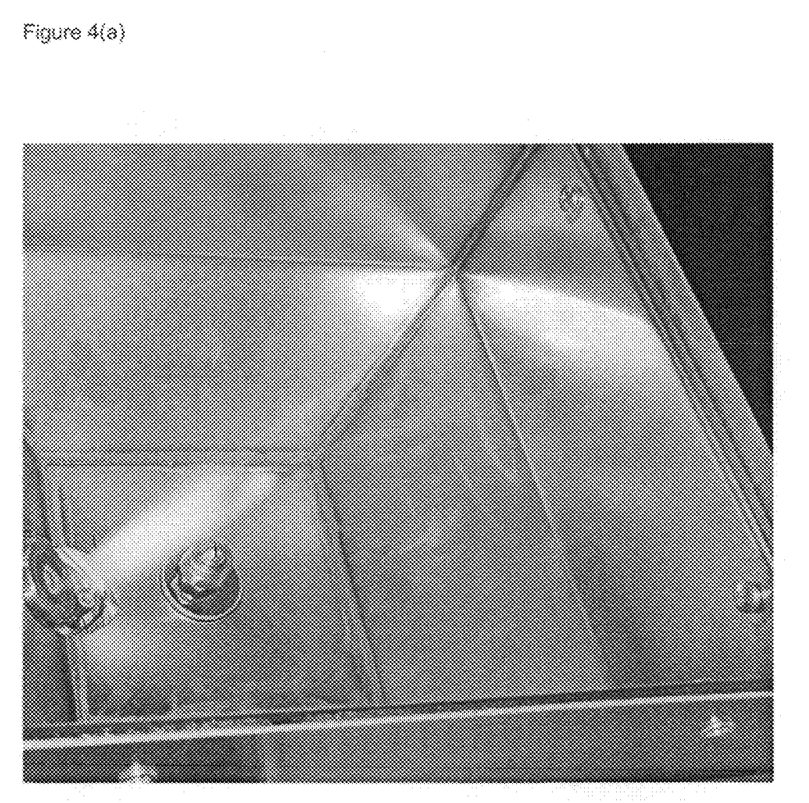
Figure 4B:
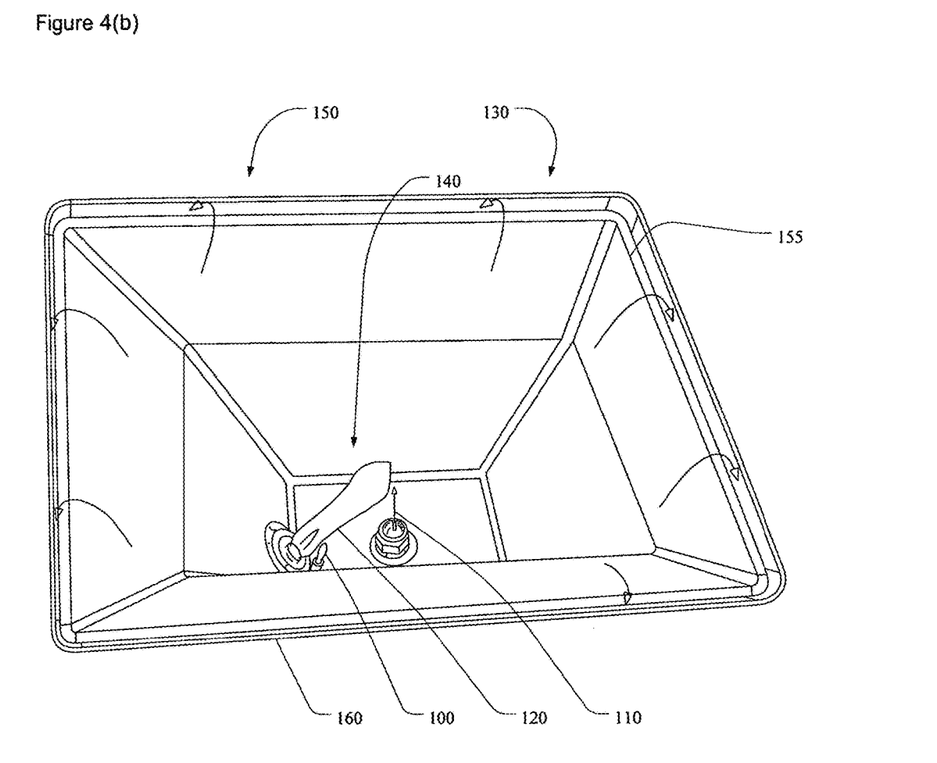

At this point the exhaust vacuum should be running, and after a short amount of time, the pilot light will auto ignite (small blue flame) and there should be an orange flame coming out of the Nanomiser device. The flame color will change from orange to green indicating that the antimicrobial deposition solution has reached the device. Refer to FIG. 3 and FIG. 4.

WARNING: IF FLAME COLOR DIFFERS FROM FIG. 3 AND FIG. 4, IMMEDIATELY SHUT DOWN THE SYSTEM AND CONTACT YOUR SUPERVISOR.

WARNING: SHROUD WILL BECOME HOT WHEN RUNNING A DEPOSITION. DO NOT TOUCH WHILE RUNNING.

WARNING: ONLY PERFORM DEPOSITIONS ON SURFACES THAT CAN HANDLE ELEVATED TEMPERATURES. NO CARPETED AREAS!

During Deposition

Slowly roll the shroud across a hard surface to apply the antimicrobial coating. All surfaces should have about 5 seconds of exposure to the deposition system. This can be as a slow single pass or as 2 or more faster passes over each area. Do not allow the deposition head to not move for more than 15 seconds on any surface except for its start-up and shut down holder on the portable coater, which can be used to put the system for up to 10 minutes when the system is briefly not being used.

Shut Down

To shut down P15ANSC under normal operating conditions, press the SHUT DOWN button located below the display screen. The exhaust vacuum should continue running and in about two minutes the flame color will turn back to orange indicating that the flushing solvent has been pumped through all the tubing.

WARNING: DO NOT STORE P15ANSC OR LEAVE FOR EXTENDED PERIODS OF TIME WITH ANTIMICROBIAL SOLUTION IN THE TUBING!!! THIS WILL DAMAGE THE SYSTEM

OVER TIME. ALWAYS CHECK FOR AN ORANGE FLAME BEFORE TURNING SYSTEM OFF.

The exhaust vacuum will continue to run for a few minutes after the flame is extinguished. This is to help cool the coating head assembly. Once the small red LED light directly above the SHUT DOWN button turns off and the STATUS screen changes to green, the shut down sequence is complete.

Emergency Shut Down

There are two ways to perform an emergency shut down.

The Main Disconnect is located on the panel directly below the display screen on the control unit. Rotate the knob counter clockwise (CCW) a quarter turn. This will turn off all unit components. Rotate knob a quarter turn in the clockwise direction to restart the unit. There will be short reset period. The unit is ready once the control display reads "nGimat Systems P15ANSC" on the default screen.

The EMERGENCY STOP button is located on the control panel to the right of the display screen. Depress the EMERGENCY STOP button to turn off power to the liquid pump, nanoPOWER, and inhibit ignition, but the exhaust vacuum stays on. Pull button out to start the unit again. Currently the unit will start back up and continue whatever sequence it was performing before the button was depressed. To start at a different sequence turn the power off and then on again at the Main Disconnect knob.

All documents, books, manuals, papers, patents, published patent applications, guides, abstracts, and other references cited herein are incorporated by reference in their entirety. Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

We claim:

1. The dry-deposition nanocoating machine that is portable, comprising:
    a flame-based machine;
    an exhaust shroud around a deposition area of the flame-based machine to remove spent deposition gasses and material;
    wheels, wherein the flame-based machine is mounted on the wheels and movable by a human operator; and
    an electronic control system configured to control the flame-based machine;
    wherein the flame-based machine is in communication with the electronic control system and configured to apply a nanocoating layer, wherein the nanocoating layer applied by the flame-based machine has a thickness of less than 100 nanometers.

2. The dry-deposition nanocoating machine of claim 1, where the flame-based machine is electronically powered by 2200 W or less.

3. The dry-deposition nanocoating machine of claim 2, where the flame-based machine is electrically powered by 1600 W or less.

4. The dry-deposition nanocoating machine of claim 1, where the flame-based machine uses no bottled oxygen.

5. The dry-deposition nanocoating machine of claim 1, further comprising a standard, widely available pressurized fuel gas bottle to generate a pilot flame.

6. The dry-deposition nanocoating machine of claim 1, where the flame-based machine uses no bottled inert gas.

7. The dry-deposition nanocoating machine of claim 1, where the electronic control systems includes an auto igniter and flame sensor.

8. The dry-deposition nanocoating machine of claim 1, further comprising an air knife to cool and direct deposition gases to a surface to be coated.

9. The dry-deposition nanocoating machine of claim 1, where said flame-based machine uses precursors dissolved in a flammable liquid to form a primary deposition flame and vapors from which the nanocoating layer is formed.

10. The dry-deposition nanocoating machine of claim 9, wherein the flame-based machine uses a combustion chemical vapor deposition (CCVD) process or a nanospray combustion process.

* * * * *